(12) United States Patent
Luo et al.

(10) Patent No.: US 11,087,823 B2
(45) Date of Patent: Aug. 10, 2021

(54) NONVOLATILE MEMORY STRUCTURES WITH DRAM

(71) Applicant: Aspiring Sky Co. Limited, Hong Kong (CN)

(72) Inventors: Zhijiong Luo, Hopewell Township, PA (US); Xuntong Zhao, Shanghai (CN)

(73) Assignee: Aspiring Sky Co. Limited, Hong Kong (CN)

( * ) Notice: Subject to any disclaimer, the term of this patent is extended or adjusted under 35 U.S.C. 154(b) by 0 days.

(21) Appl. No.: 16/720,082

(22) Filed: Dec. 19, 2019

(65) Prior Publication Data

US 2020/0126610 A1 Apr. 23, 2020

Related U.S. Application Data

(63) Continuation of application No. 15/704,011, filed on Sep. 14, 2017, now Pat. No. 10,559,344.

(Continued)

(51) Int. Cl.
*G11C 14/00* (2006.01)
*G11C 11/408* (2006.01)
(Continued)

(52) U.S. Cl.
CPC ...... *G11C 11/4085* (2013.01); *G06F 12/0246* (2013.01); *G06F 12/0638* (2013.01);
(Continued)

(58) Field of Classification Search
CPC ... G11C 11/4085; G11C 8/10; G11C 14/0063; G11C 5/025; G11C 7/12; G11C 7/18; G11C 8/08; G11C 11/419; G11C 11/418; G11C 16/08; G11C 14/00; G11C 14/0054; G11C 14/0009; G06F 12/0246;
(Continued)

(56) References Cited

U.S. PATENT DOCUMENTS 6,525,562 B1   2/2003   Schultz et al.
8,861,271 B1   10/2014  Zain
(Continued)

OTHER PUBLICATIONS

Single-chip Integration of SRAM and Non-volatile Memory using Bit-line sharing (2006 IEEE) 2006 Proceedings of the 32nd European Solid-State Circuits Conference, pp. 295-298.

*Primary Examiner* — David Lam
(74) *Attorney, Agent, or Firm* — Hertzberg, Turk & Associates, LLC

(57) ABSTRACT

Technologies for a multi-bit non-volatile dynamic random access memory (nvDRAM) device, which may include a DRAM array having a plurality of DRAM cells with single or dual transistor implementation and a non-volatile memory (NVM) array having a plurality of NVM cells with single or dual transistor implementations, where the DRAM array and the NVM array are arranged by rows of word lines and columns of bit lines. The nvDRAM device may also include one or more of isolation devices coupled between the DRAM array and the NVM array and configured to control connection between the dynamic random access bit lines (BLs) and the non-volatile BLs. The word lines run horizontally and may enable to select one word of memory data, whereas bit lines run vertically and may be connected to storage cells of different memory address.

19 Claims, 15 Drawing Sheets

Related U.S. Application Data

(60) Provisional application No. 62/781,788, filed on Dec. 19, 2018, provisional application No. 62/395,581, filed on Sep. 16, 2016.

(51) Int. Cl.
| | | |
|---|---|---|
| *G11C 8/10* | (2006.01) | |
| *G11C 5/02* | (2006.01) | |
| *G11C 7/12* | (2006.01) | |
| *G11C 7/18* | (2006.01) | |
| *G11C 8/08* | (2006.01) | |
| *G11C 11/419* | (2006.01) | |
| *G06F 12/02* | (2006.01) | |
| *G06F 12/06* | (2006.01) | |
| *G06F 13/16* | (2006.01) | |
| *G11C 11/418* | (2006.01) | |
| *G11C 16/08* | (2006.01) | |

(52) U.S. Cl.
CPC .......... *G06F 13/1694* (2013.01); *G11C 5/025* (2013.01); *G11C 7/12* (2013.01); *G11C 7/18* (2013.01); *G11C 8/08* (2013.01); *G11C 8/10* (2013.01); *G11C 11/419* (2013.01); *G11C 14/0063* (2013.01); *G06F 2212/1016* (2013.01); *G06F 2212/1028* (2013.01); *G06F 2212/205* (2013.01); *G06F 2212/7203* (2013.01); *G11C 11/418* (2013.01); *G11C 14/00* (2013.01); *G11C 16/08* (2013.01); *Y02D 10/00* (2018.01)

(58) Field of Classification Search
CPC ............. G06F 12/0638; G06F 13/1694; G06F 2212/1016; G06F 2212/1028; G06F 2212/205; G06F 2212/7203; Y02D 10/00
See application file for complete search history.

(56) References Cited

U.S. PATENT DOCUMENTS

| | | |
|---|---|---|
| 9,318,196 B1 | 4/2016 | Kasai |
| 9,349,440 B1 | 5/2016 | Ma |
| 9,473,204 B2 | 10/2016 | Lin et al. |
| 9,640,256 B1 | 5/2017 | Roy |
| 2003/0001615 A1 | 1/2003 | Sueyoshi et al. |
| 2003/0235095 A1* | 12/2003 | Inoue .................... G11C 11/405 365/201 |
| 2007/0297396 A1 | 12/2007 | Eldar |
| 2008/0195803 A1 | 8/2008 | Park et al. |
| 2010/0302849 A1* | 12/2010 | Jung ...................... G11C 16/26 365/185.08 |
| 2011/0087841 A1 | 4/2011 | Toh et al. |
| 2013/0207170 A1 | 8/2013 | Kurokawa |
| 2014/0085978 A1 | 3/2014 | Lee |
| 2014/0368235 A1 | 12/2014 | Aoki et al. |
| 2015/0348621 A1 | 12/2015 | Sako |
| 2016/0019964 A1* | 1/2016 | Sadd .................. G11C 14/0063 365/185.08 |
| 2016/0071590 A1* | 3/2016 | Hsu .................... G11C 14/0018 365/185.08 |
| 2016/0078938 A1 | 3/2016 | Hsu |
| 2016/0098811 A1 | 4/2016 | Lu |
| 2016/0173103 A1 | 6/2016 | Gao et al. |

\* cited by examiner

NONVOLATILE MEMORY STRUCTURES WITH DRAM

CROSS REFERENCE TO RELATED APPLICATIONS

This application is a continuation under 35 U.S.C. § 120 of co-pending U.S. patent application Ser. No. 15/704,011 filed on Sep. 14, 2017, which claims the benefit of U.S. Provisional Patent Application Ser. No. 62/395,581 filed on Sep. 16, 2016. This application also claims the benefit of U.S. Provisional Patent Application Ser. No. 62/781,788 filed on Dec. 19, 2018. The disclosures of the above application are hereby incorporated by reference for all purposes.

BACKGROUND

Unless otherwise indicated herein, the materials described in this section are not prior art to the claims in this application and are not admitted to be prior art by inclusion in this section.

Volatile semiconductor memories such as static random-access memory (SRAM) or DRAM may be utilized in computer design because of their relatively low power consumption, speed, and simple operation, while non-volatile memories (NVM) such as one time programmable (OTP) memory, EEPROM, flash memory, or even PCM, have the advantage of storing configuration data, even when a flash-equipped device is powered on or off.

Many of today's system architectures, utilize both the volatile memory and the non-volatile memory devices, generally implemented separately. Because the memories devices are not in the same array layout, large area may be consumed by the system architecture. Further, it may reduce speed of transferring data from SRAM to NVM.

SUMMARY

Briefly stated, technologies are generally described herein for nonvolatile memory (NVM) structure combinations with dynamic random access memory (DRAM) and methods thereof.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
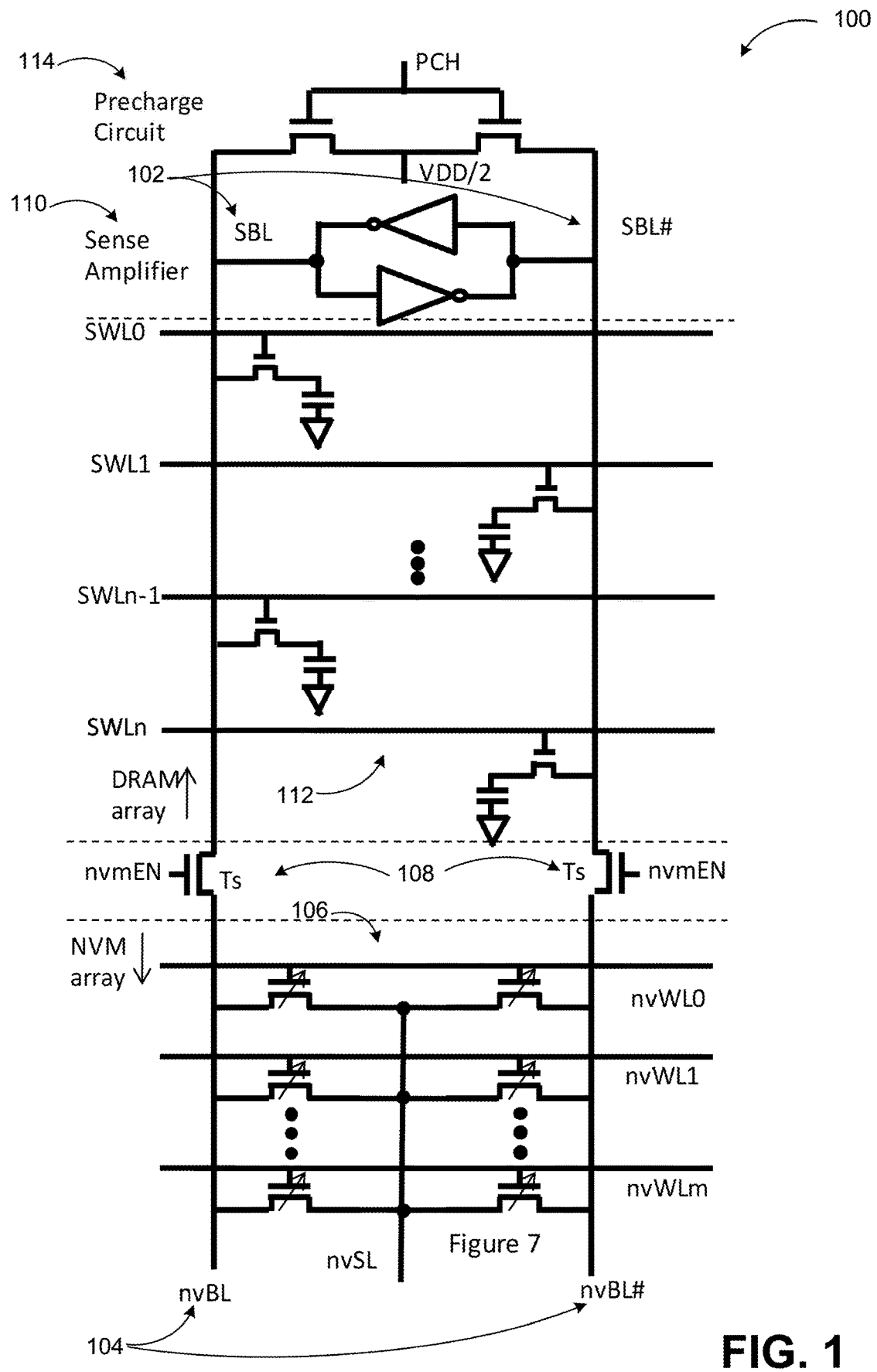
FIG. 1 is a schematic circuit diagram illustrating an example multi-bit nvDRAM device with arrayed DRAM and NVM, and a pre-charge circuit.

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for a multi-bit non-volatile dynamic random access memory (nvDRAM) device, which may include a DRAM array having a plurality of DRAM cells with single or dual transistor implementation and a non-volatile memory (NVM) array having a plurality of NVM cells with single or dual transistor implementations, where the DRAM array and the NVM array are arranged by rows of word lines and columns of bit lines. The nvDRAM device may also include one or more of isolation devices coupled between the DRAM array and the NVM array and configured to control connection between the dynamic random access bit lines (BLs) and the non-volatile BLs. The word lines run horizontally and may enable to select one word of memory data, whereas bit lines run vertically and may be connected to storage cells of different memory address.

As used herein, NVM memory may include, but is not limited to, a floating gate memory, a SONOS memory, a RRAM (resistive RAM), phase change memories, or magnetic base memories, such as MRAM, and STTRAM.

FIG. 1 is a schematic circuit diagram illustrating an example multi-bit nvDRAM device with arrayed DRAM and NVM, and a pre-charge circuit, arranged in accordance with at least some embodiments described herein.

In FIG. 1, the circuit diagram 100 includes a DRAM array 112, a NVM array 106 and a switch (bit line isolation) device 108 (transistors Ts) coupled between the DRAM array and the NVM array. The multi-bit nvDRAM device further includes a sense amplifier 110 and a pre-charge circuit 114. Each DRAM cell is made up of a single transistor, whereas each NVM cell comprises two transistors. According to some embodiments, the DRAM bit-line SBL/SBL# 102 and NVM bit-line nvBL/nvBL# 104 may be initialized at ground level before reading. Then, NVM cell may be turned on by nvWL while the device Ts is turned on. A VDD voltage level may be applied to nvSL, the nvBL/nvBL# may be charged up through the NVM cell. Finally, the SA power may be ramped up. Due to the Vt difference between the differential NVM cell, SBL/SBL# may have a difference and then the data may be latched by the sense amplifier. After turning pm DRAM cell by SWL, the data may be written into DRAM cell.

According to other embodiments, the DRAM bit-line SBL/SBL# and NVM bit-line nvBL/nvBL# may be initialized at VDD before reading. Then, NVM cell may be turned on by nvWL while turning on the device Ts. A GND voltage level may be applied to nvSL, the nvBL/nvBL# may be discharged down through the NVM cell. Finally, SA may be enabled. Due to the Vt difference between the differential NVM cell, SBL/SBL# may have a difference and then the data may be latched by a sense amplifier. After turning DRAM cell by SWL, the data may be written into DRAM cell.

For the sake of simplicity of explanation herein, inversion circuitry will be generally described in the context of various inverters. Other types of inversion circuitry configured to provide inversion capability may be used, alternatively or additionally to inverters. Such other types of inversion circuitry may include, for example, inversion logic configurations and logic gates (NAND, NOR, AND, etc. suitably coupled to provide inversion), analog and/or digital inversion circuits, transmission gates, flip-flops, bistable latches, and/or others.

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

The NVM array 106 having a plurality of NVM memory cells may implemented in a matrix by m rows coupled to a plurality of word lines (e.g., first word line nvWL0, mth word line nvWLm, etc.) and x columns coupled to bit lines (nvBL0 to nvBL0#). In one embodiment, the number of columns may remain same for the DRAM array and the NVM array.

Each NVM cell may include two floating gate field effect transistors (FETs) in a differential configuration. The floating gate memory transistor having a gate region, a source region and a drain region. The transistors may be arranged in parallel in columns with their drain connect to a common drain or bit line, and their source to a common source line.

The gates of the NVM cells may connected to the wordline nvWL0 and a source to drain (S/D) terminal of the cell may connected to a bit-line nvBL0/nvBL0# and a source-line nvSL0. A first set of bit lines may be connected to a drain region of memory transistor in each of the memory cells in a respective column nvBL0. A second set of bit lines may each provide a source line nvSL0 that is electrically connected to a source region of memory transistor in each of the memory cells along a respective column. The common source line nvSL0 and nvSLx may be separated individually or connected together.

One or more of switch devices 108 may be coupled between the DRAM array 112 and the NVM array 106 and configured to control connection between the random access bit lines (BLs) and the non-volatile BLs through a control signal nvmEN. In one example, the one or more switch devices may include NMOS transistor or PMOS transistor.

Different switch devices may be used to control the connection between the plurality of DRAM cells and the NVM cells. The switch device Ts may connect the DRAM bit line SBL0 with NVM bit line nvBL0 by turning on a control signal nvmEN. The DRAM bit-line SBL0 may be separated from NVM bit-line nvBL0 by turning off the switch device Ts. As a result, the DRAM bit-line loading between DRAM and NVM may be reduced. In addition, the DRAM read/write speed may improve while the power consumption may be reduced. "m" (row number of NVM) may be N times "n" (row number of DRAM), where N is equal or greater than 1.

Figure 2:
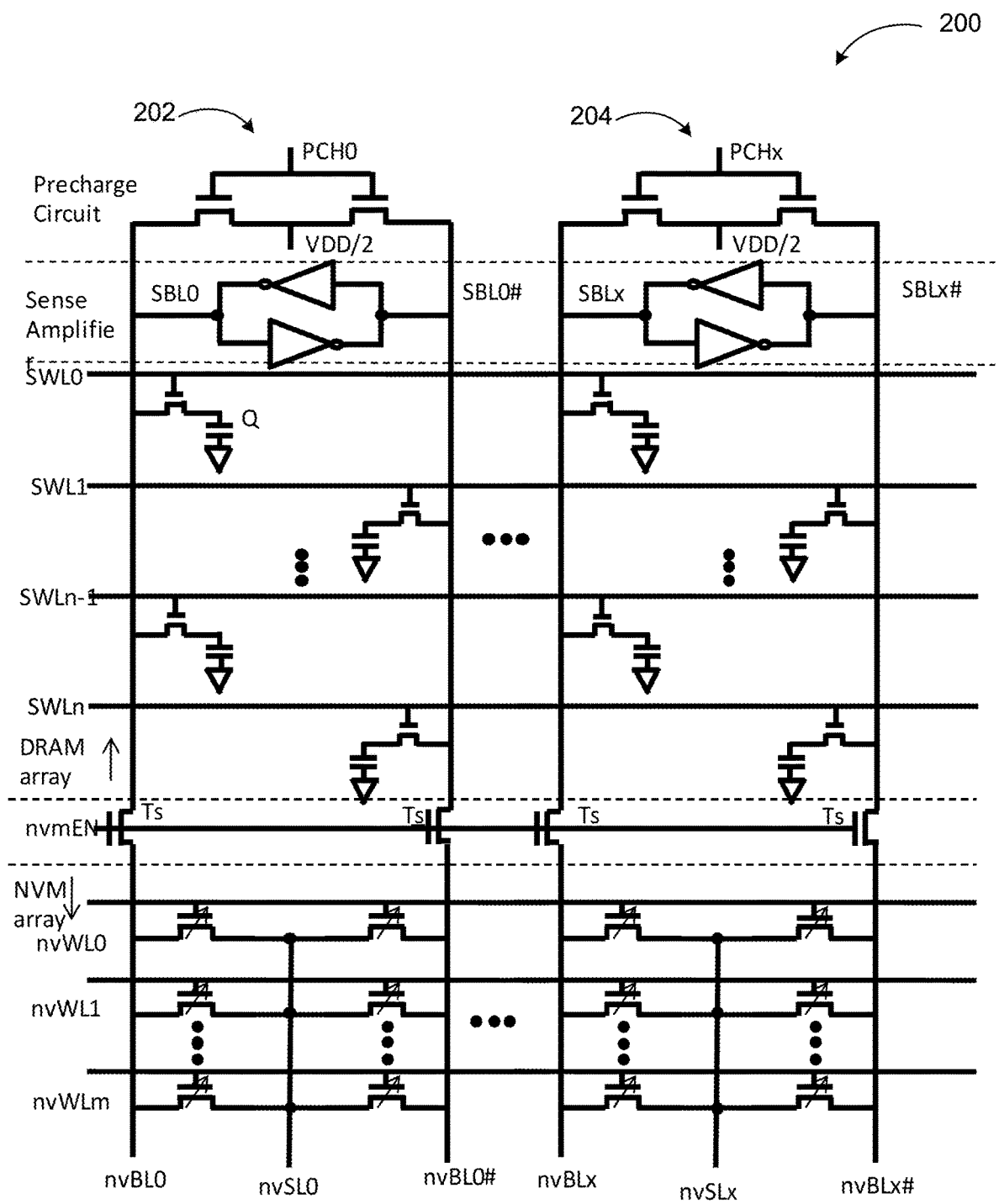
FIG. 2 is a schematic circuit diagram illustrating multiple columns of the multi-bit nvDRAM shown in FIG. 1.

FIG. 2 is a schematic circuit diagram illustrating multiple columns of the multi-bit nvDRAM shown in FIG. 1, arranged in accordance with at least some embodiments described herein.

As illustrated in FIG. 2, the device 200 may include a differential pair of the NVM cell for each single transistor DRAM cell. The BLs of the DRAM cells may be connected to BLs of the NVM cells through a switch device Ts.

In one embodiment, during operation, the DRAM cell data may be written back to the NVM cell, and the NVM cell data may be loaded into the DRAM cell. Each DRAM cell may read data from the differential pair of the NVM cell and write data to one pair of NVM cell in case a row number of DRAM array equal to the row number of NVM array. In other embodiment, the multi-bit nvDRAM may transfer data between one DRAM row and a fixed NVM row.

In another embodiment, the multi-bit nvDRAM may transfer data between one DRAM row and any one of the NVM rows. Each DRAM cell may read data from multiple NVM cells and write data to multiple NVM cells by implementing more NVM rows along the same BL line pair, where m is several times of n. e.g. m=4*n, each DRAM cell may use 4-bit NVM cell from data storage, the data transfer may between SWL0 and nvWL[3:0], SWL1 and nvWL[7:4].

In one embodiment, the multi-bit nvDRAM may transfer data between 1 DRAM row and a fixed group of NVM rows. E.g. row0 of DRAM corresponding to NVM row[3:0], row1 of DRAM corresponding to NVM row[7:4], etc. the NVM row group may be any rows in the NVM array.

In yet another embodiment, the multi-bit nvDRAM may transfer data between 1 DRAM row and any group of NVM rows. E.g. row0 of DRAM may corresponding to NVM row [3:0], while row1 of DRAM may corresponding to NVM row [7:4] or row0 of DRAM may corresponding to NVM row [7:4], while row1 of DRAM may corresponding to NVM row [11:8]. The NVM row group may be any rows in the NVM array.

Figure 3:
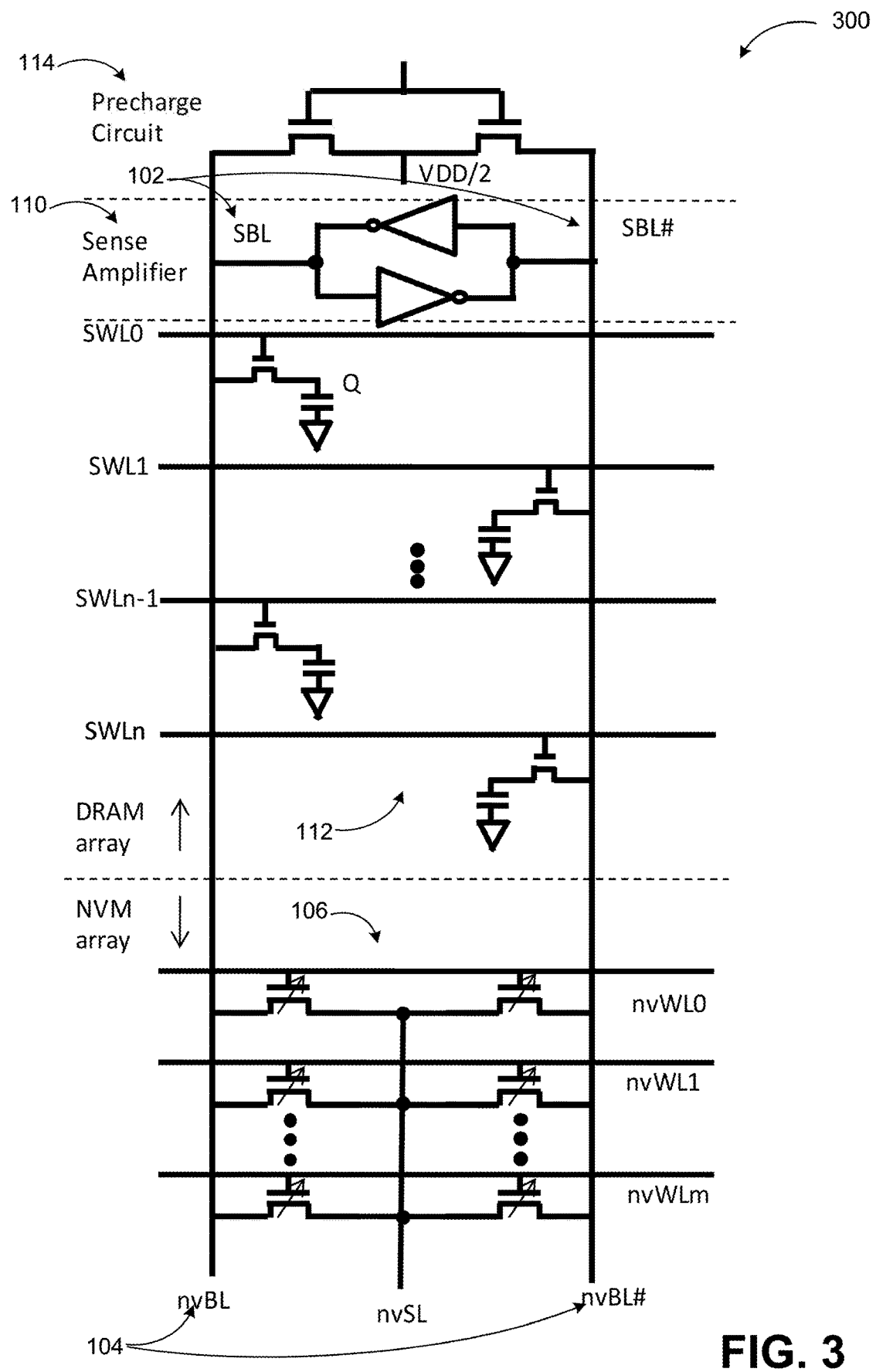
FIG. 3 is a schematic circuit diagram illustrating an example small multi-bit nvDRAM device with a shared bit line instead of a bit line isolation device.

FIG. 3 is a schematic circuit diagram illustrating an example small multi-bit nvDRAM device with a shared bit line instead of a bit line isolation device, arranged in accordance with at least some embodiments described herein.

As shown in diagram 300 of FIG. 3, a small array of DRAM and NVM cells may be implemented, only a few rows for both DRAM array and NVM array. In this case, the device Ts may be removed and the structure may be simplified as a bit-line sharing structure of the DRAM array and the NVM array. Due to the small array density, the bit-line loading is still small. The DRAM read/write speed is still fast and still low power.

Figure 4:
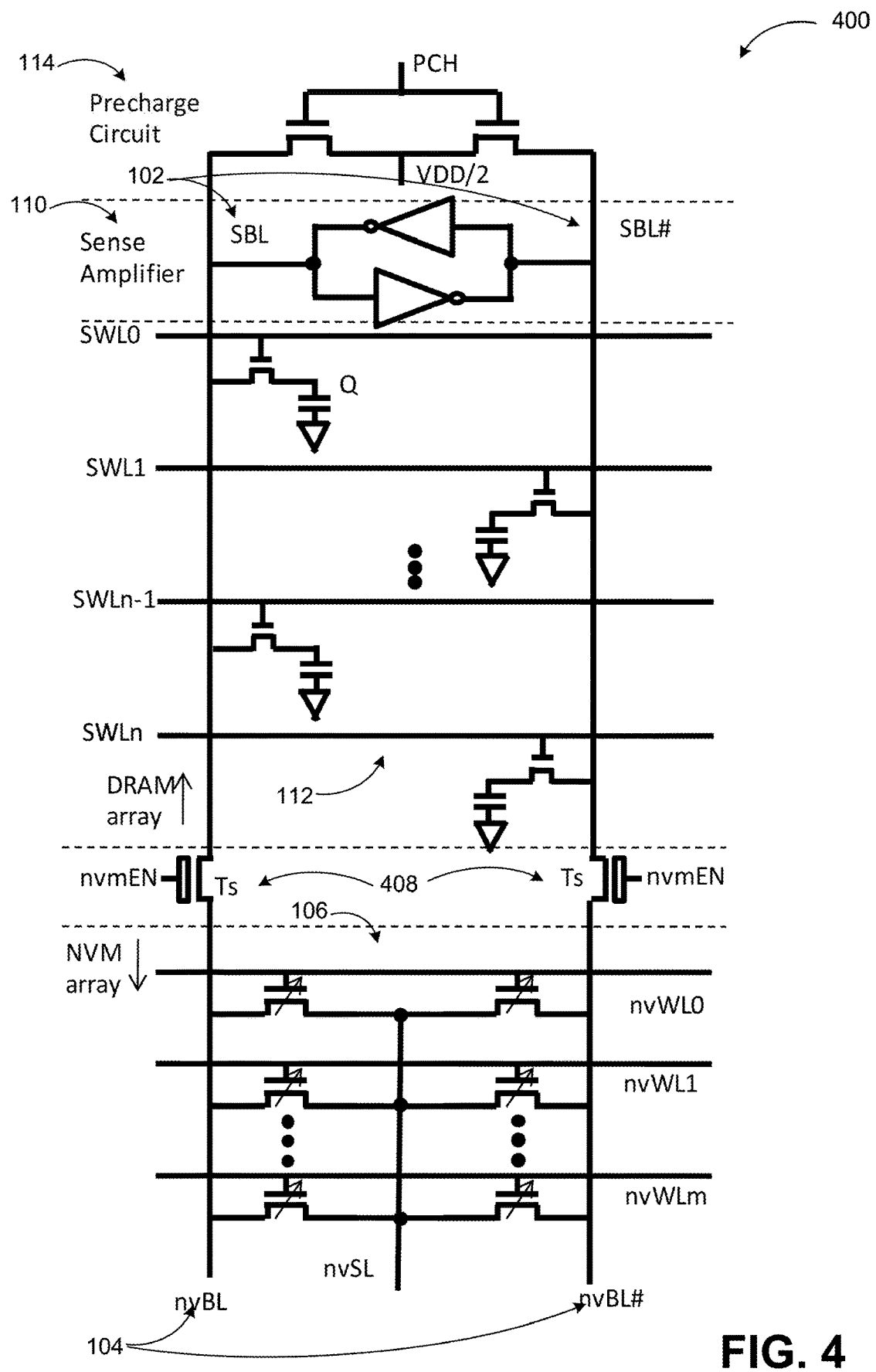
FIG. 4 is a schematic circuit diagram illustrating an example multi-bit nvDRAM device with arrayed DRAM and NVM, and a pre-charge circuit, including a high voltage device as the bit line isolation device.

FIG. 4 is a schematic circuit diagram illustrating an example multi-bit nvDRAM device with arrayed DRAM and NVM, and a pre-charge circuit, including a high voltage device as the bit line isolation device, arranged in accordance with at least some embodiments described herein.

In some embodiments as shown in diagram 400, the BL isolation device Ts may be replaced with a high voltage HV device 408. An NVM cell that may bias a high voltage (higher than VDD) to nvBL/nvBL# for write operation. The HV device Ts may isolate the DRAM bit-line from the high voltage applied to the NVM bit-line. An extra write driver for NVM bit-line may be needed. "m" (row number of NVM) may be N times "n" (row number of DRAM), where N is equal or greater than 1.

Figure 5:
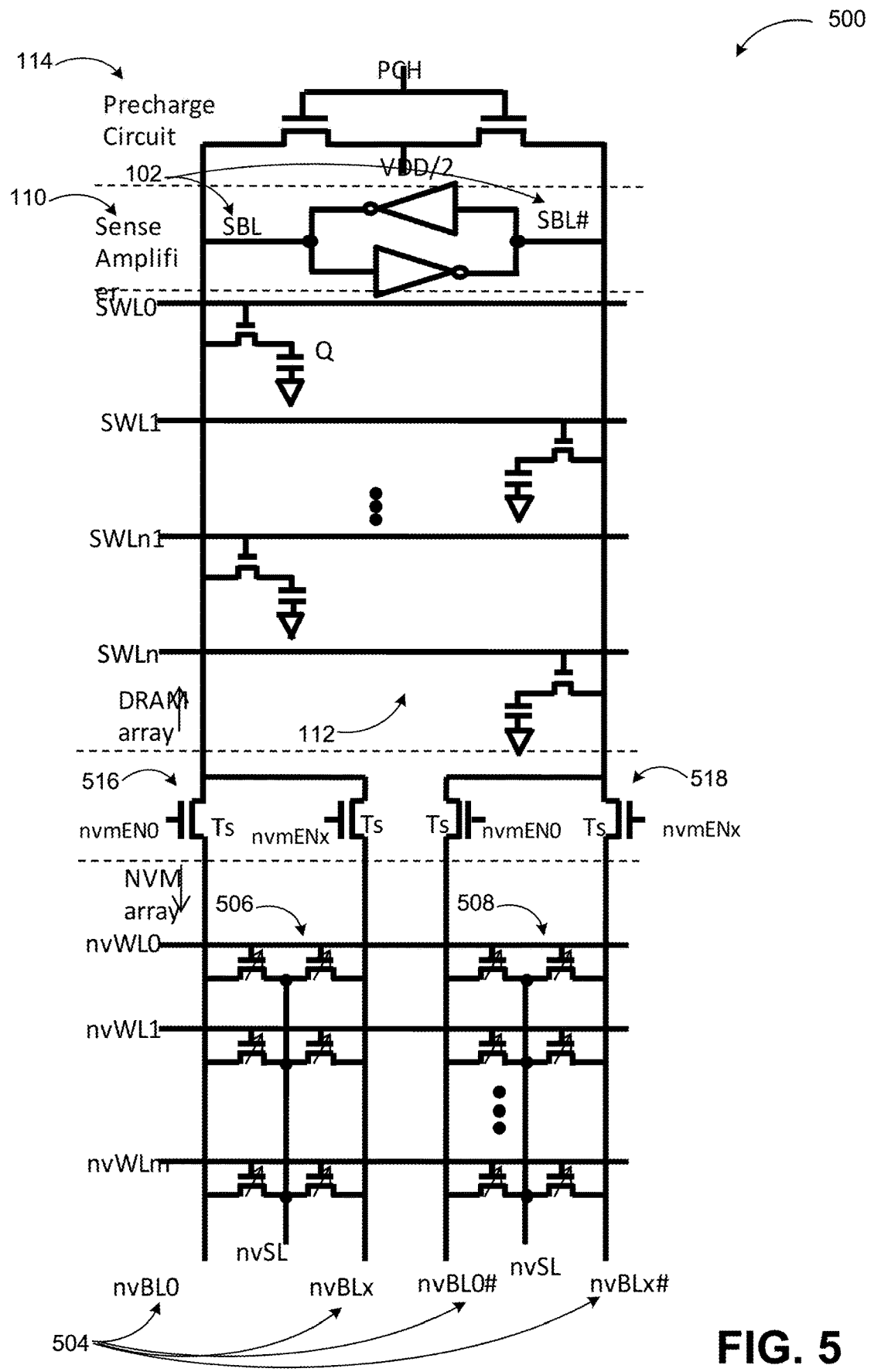
FIG. 5 is a schematic circuit diagram illustrating an example multi-bit nvDRAM device with arrayed DRAM and NVM, and a pre-charge circuit, where the DRAM bit line may be coupled to multiple NVM bit lines.

FIG. 5 is a schematic circuit diagram illustrating an example multi-bit nvDRAM device with arrayed DRAM and NVM, and a pre-charge circuit, where the DRAM bit line may be coupled to multiple NVM bit lines, arranged in accordance with at least some embodiments described herein.

In one embodiment, the DRAM bit-line SBL may be connected to multiple NVM bit-lines 504 nvBL[x:0] (dual NVM columns 506, 508), which can be decoded by the select signal nvmEN[x:0]. For read data from NVM to DRAM, nvmEN0 may be enabled and the differential pair state on nvBL0/nvBL0# may be loaded into the DRAM cell.

Next, nvmENx may be enabled and the differential pair state on nvBLx/nvBLx# may be loaded into the DRAM cell. To write data from DRAM to NVM, a program operation may be executed on nvBL0/nvBL0# by turning on nvmEN0, while other bit-line such as nvBLx/nvBLx# may be floating and the program may be inhibited. This structure may be pitch aligned in layout as the NVM cell pitch may be smaller than the DRAM cell in some advanced process.

Figure 6:
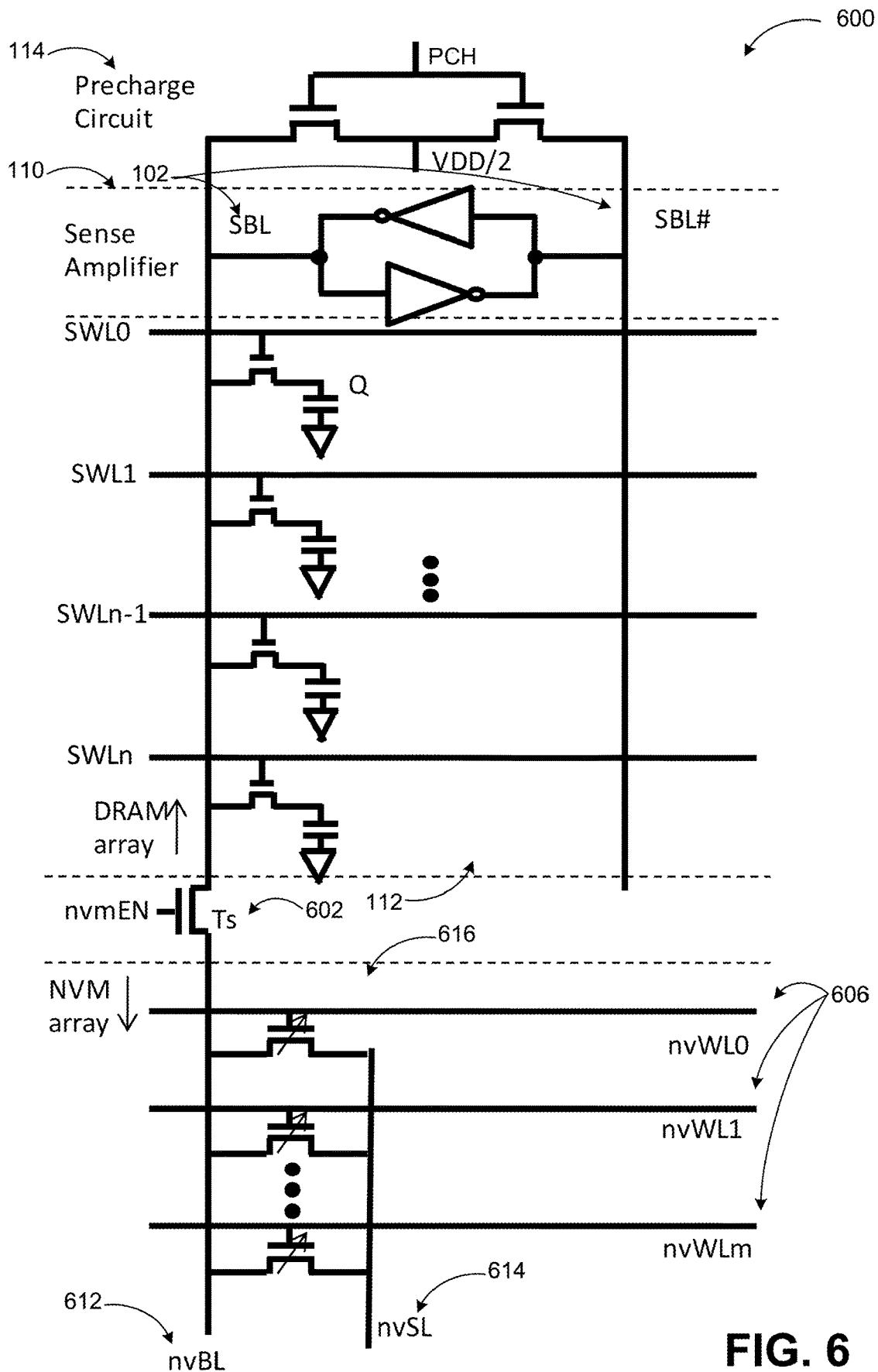
FIG. 6 is a schematic circuit diagram illustrating an example multi-bit nvDRAM device with arrayed DRAM and NVM, and a pre-charge circuit, where the NVM has a single cell structure as opposed to previously shown differential pair structure.

FIG. 6 is a schematic circuit diagram illustrating an example multi-bit nvDRAM device with arrayed DRAM and NVM, and a pre-charge circuit, where the NVM has a single cell structure as opposed to previously shown differential pair structure, arranged in accordance with at least some embodiments described herein.

The read operation may be started with a VDD level applied to nvSL/RSL 614 (reference source line) and turning on the DRAM cell word-line and NVM cell/reference cell word-line. The SBL may be charged through the NVM cell while SBL# may be charged through a reference cell. The different cell Vt between NVM cell and reference cell may make a voltage difference between SBL and SBL#. Then, the SA may be ramped up to latch the data with a sense amplifier. In some embodiments, a bit-line capacitance CBL may be tied to the reference side, which can compensate the NVM bit-line 612 loading for SBL/SBL# match.

The NVM cell may also be connected with SBL#, while the reference cell is connected with SBL. In the single cell structure, the DRAM bit-line SBL may also be connected to multiple NVM bit-lines for layout pitch alignment. In the single cell structure, the NVM cell may be a single-level cell (SLC) or a multi-level cell (MLC). A complex read/write flow may be needed when use the MLC cell. SBL and SBL# may be balanced by reference circuits. "m" (row number of NVM) may be N times "n" (row number of DRAM), where N is equal or greater than 1.

Figure 7:
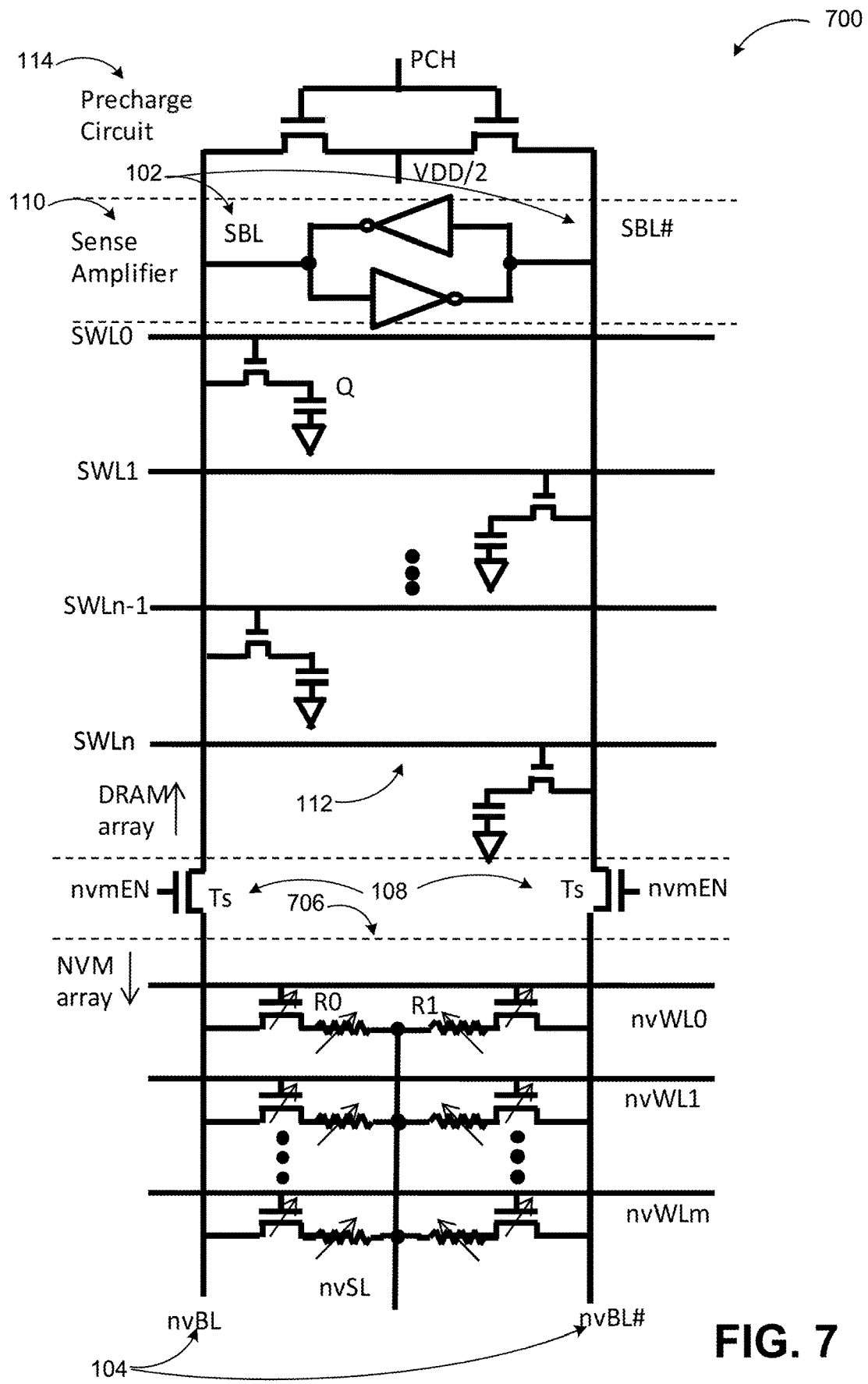
FIG. 7 is a schematic circuit diagram illustrating an example multi-bit nvDRAM device with arrayed DRAM and NVM, and a pre-charge circuit, where the NVM has a one-transistor-one-resistor (1T1R) cell structure.

FIG. 7 is a schematic circuit diagram illustrating an example multi-bit nvDRAM device with arrayed DRAM and NVM, and a pre-charge circuit, where the NVM has a one-transistor-one-resistor (1T1R) cell structure, arranged in accordance with at least some embodiments described herein.

In diagram 700, the top NVM cell may be a 1T1R cell that includes a transistor and a programmable resistor. The source-line nvSL may be a common line or a separated signal line for each column of the NVM array. The programmable resistor may be programmed to at least two resistance states, a LRS (low resistance state) and a FIRS (high resistance state). In one embodiment, the programmable resistor may be a MRAM device. e.g. a STT MTJ device (a spin transfer torque magnetic tunnel junction resistor).

During an operation, a voltage (equal to VDD, or higher than VDD in some examples) may be applied to nvSL, and nvBL/nvBL# pulled to ground, while nvWL0 active, both R0 and R1 may be turned to a LRS state. A voltage (VDD-Vt, for example) may be applied to nvBL, and ground level to nvSL, R0 may be turned to a HRS state by turning on nvWL0. R1 may be turned to HRS state by applying nvBL# to VDD, nvSL to ground and nvWL0 to VDD.

Before data transfer from DRAM to NVM, nvSL may biased to a VDD level or a higher level and nvBL/nvBL# may initialized at a ground level. Active the nvWL may turn the MTJ device to a LRS state. SBL and SBL# may be pre-charged to VDD/2. Then, nvSL may be biased to a ground level, active DRAM word-line, Ts and NVM word-line, DRAM cell and sense amplifier may drive nvBL/nvBL# to a logic '0' or '1' level. For example, Q=1, nvBL may be at VDD while nvBL# at ground level. R0 may be turned to a HRS state while R1 is kept at the LRS state and vice-versa, Q=0 will turn R1 to FIRS state while R0 keep a LRS state.

During operation, to transfer the data from NVM to DRAM, Ts and NVM WL may be activated, then the sense amplifier power ramped up. The data '1' may be stored when R0/R1 at a HRS/LRS state, and a data '0' may be stored when R0/R1 at a LRS/HRS state. The NVM word-line may be biased at a level lower than VDD to get a low read level to reduce the disturb. "m" (row number of NVM) may be N times "n" (row number of DRAM), where N is equal or greater than 1. The programmable resistor element is not limited to MRAM, but also can be a PCRAM, FeRAM, RRAM and so on.

Figure 8:
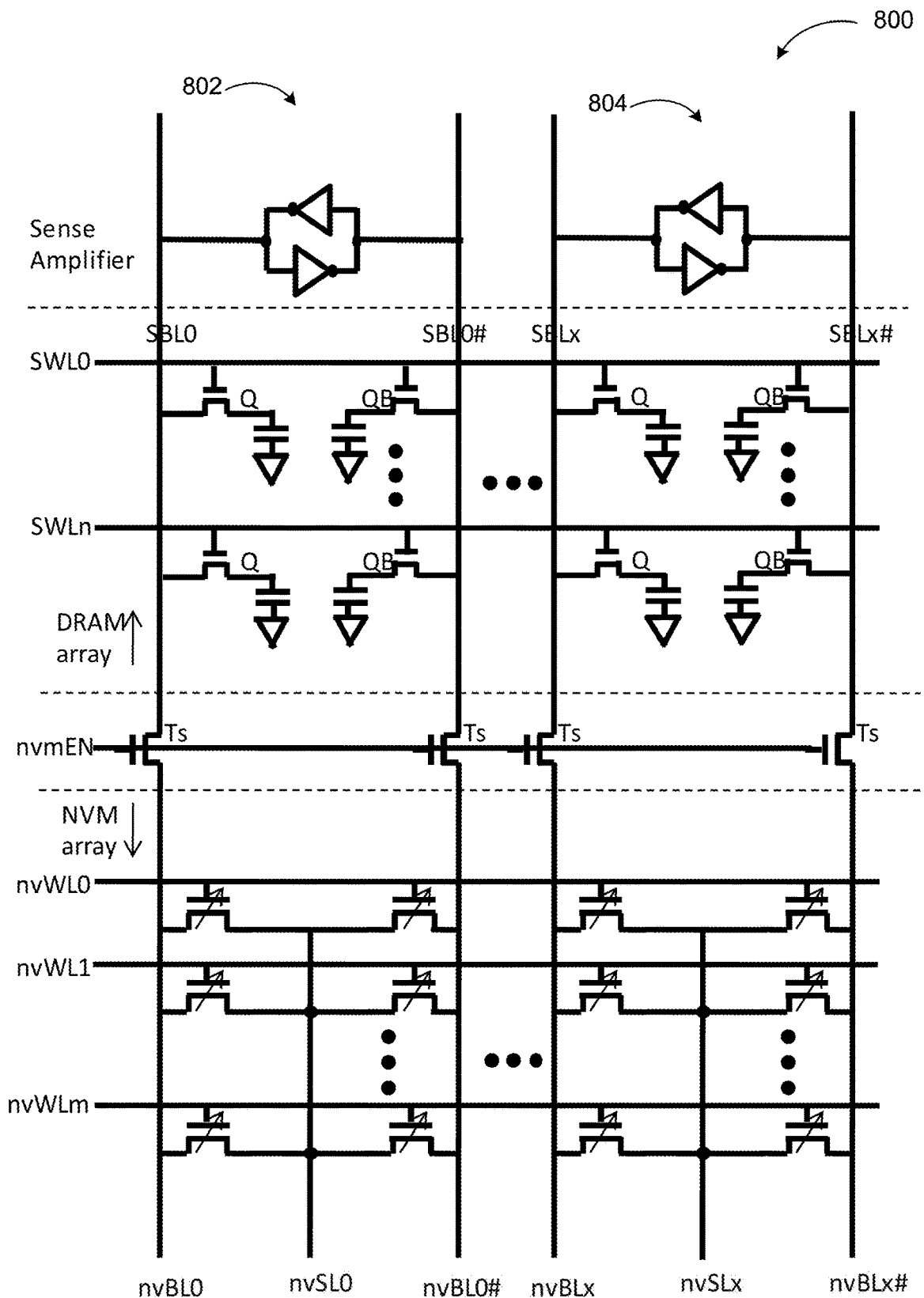
FIG. 8 is a schematic circuit diagram illustrating an example multi-bit nvDRAM device with arrayed DRAM and NVM, where the device includes a DRAM with n rows and x columns and the NVM includes m rows and x columns.

FIG. 8 is a schematic circuit diagram illustrating an example multi-bit nvDRAM device with arrayed DRAM and NVM, where the device includes a DRAM with n rows and x columns and the NVM includes m rows and x columns, arranged in accordance with at least some embodiments described herein.

In this disclosure, two example columns 802, 804 of an nvDRAM device are shown comprising a DRAM array with n rows and x columns and an NVM array with m rows and x columns. SWL[n:0] is the word-line of DRAM array and SBL[x:0],SBL[x:0]# is the bit-line of DRAM array. nvWL[m:1] is the word-line of NVM array and nvBL[x:0], nvBL[x:0]# is the bit-line of NVM array. The gates of the NVM cells are connected to the word-line nvWL and the S/D terminal of the cells is connected to a bit-line nvBL/nvBL# and a source-line nvSL.

A source-line nvSL can be a common line for the NVM cell in the array or a separated line for each column. The device Ts connects the DRAM bit-line SBL with NVM bit-line nvBL by turning on the control signal nvmEN. By putting the NVM cells into a same array, separating the DRAM cell and NVM cell in the layout region, the total layout area may be reduced. By turning off the device Ts, the DRAM bit-line can be separated from NVM bit-line, thus the DRAM bit-line loading can be reduced. Then, the DRAM read/write speed may be improved while the power consumption can be reduced.

Figure 9:
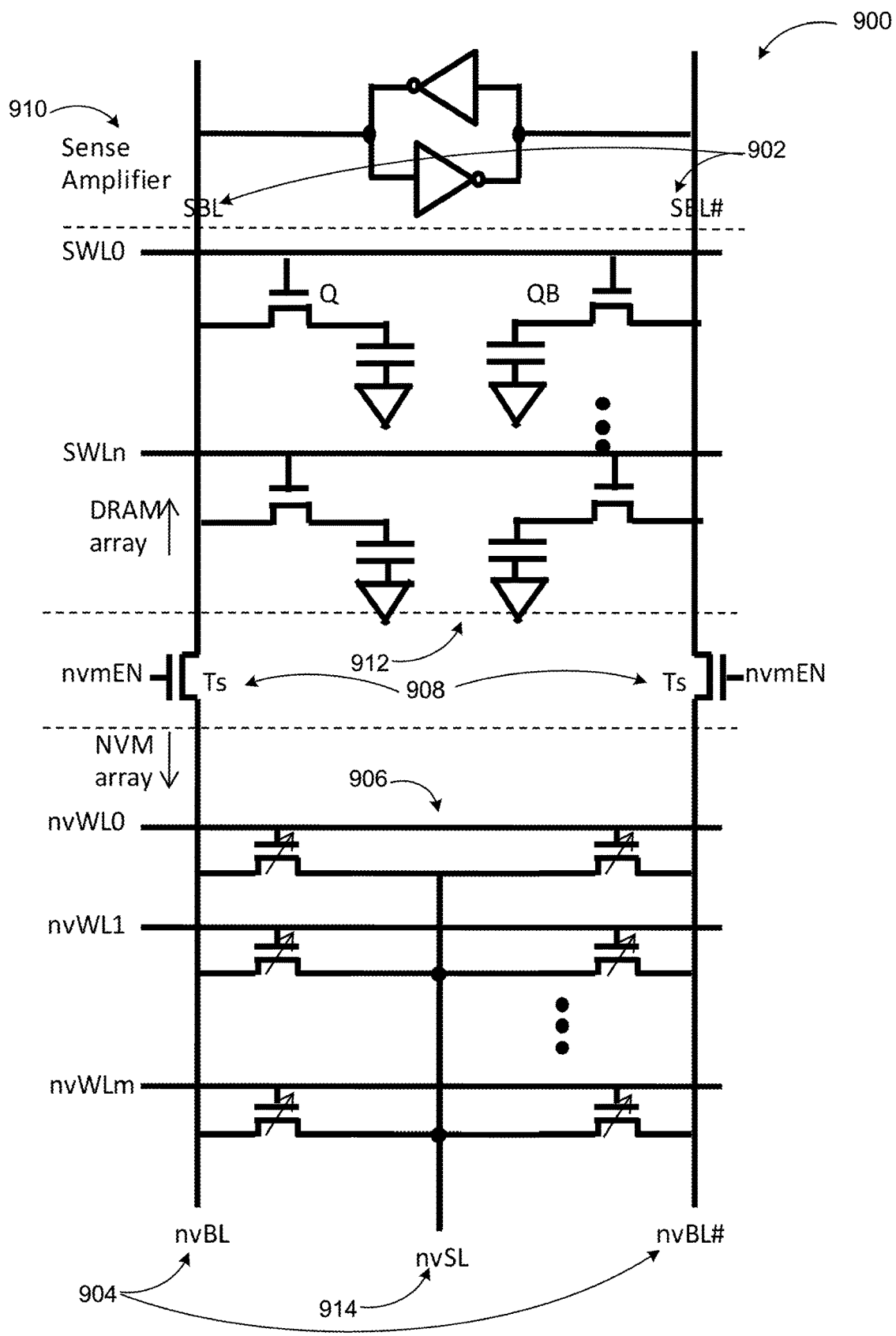
FIG. 9 is a schematic circuit diagram illustrating an example multi-bit nvDRAM device with arrayed two-transistor DRAM cells and two-transistor NVM cells.

FIG. 9 is a schematic circuit diagram illustrating an example multi-bit nvDRAM device with arrayed two-transistor DRAM cells and two-transistor NVM cells, arranged in accordance with at least some embodiments described herein.

In FIG. 9, the circuit diagram 900 includes a DRAM array 912, a NVM array 906 and a switch (bit line isolation) device 908 (transistors Ts) coupled between the DRAM array and the NVM array. The multi-bit nvDRAM device further includes a sense amplifier 910. Each DRAM cell is made up of two transistors, whereas each NVM cell also comprises two transistors.

The DRAM data may be written back to the NVM cell, and also the NVM cell data may be loaded into the DRAM cell. A differential pair of NVM cell may be implemented for each differential pair of DRAM cell. Each pair of DRAM cell may read data from one pair of NVM cell and write data to one pair of NVM cell when the row number of DRAM array is equal to the row number of NVM array. In one embodiment, the multi-bit nvDRAM may transfer data between one DRAM row and a fixed NVM row. In another embodiment, the multi-bit nvDRAM can transfer data between one DRAM row and any one of NVM rows.

Each DRAM cell may read data from multiple NVM cells and write data to multiple NVM cells by implementing more NVM rows along the same BL line pair, where m is several times of n. E.g. m=4*n, each DRAM cell can use 4-bit NVM cell fro data storage, the data translation can between SWL0 and nvWL[3:0], SWL1 and nvWL[7:4], etc.

In one embodiment, the multi-bit nvDRAM may transfer data between one DRAM row and a fixed group of NVM rows. E.g. row0 of DRAM corresponding to NVM row[3:0], row1 of DRAM corresponding to NVM row[7:4] . . . , the NVM row group may be any of the rows in the NVM array. In another embodiment, the multi-bit nvDRAM may transfer data between one DRAM row and any group of NVM rows. E.g. row0 of DRAM corresponding to NVM row[3:0], while row1 of DRAM corresponding to NVM row[7:4] . . . or row0 of DRAM corresponding to NVM row[7:4], while row1 of DRAM corresponding to NVM row[11:8] . . . , the NVM row group may be any of the rows in the NVM array.

The data transfer between DRAM cell and NVM cell is row by row. The total operation flow may need n read/write cycles as the DRAM array has n rows. In one embodiment, the NVM cell may use the SONOS split gate cell. A HVt cell on nvBL and a LVt cell on nvBL# means a data '0' (Q=0/QB=1), while a LVt cell on nvBL and a HVt cell on nvBL# means a data '1' (Q=1/QB=0).

To read data from NVM to DRAM, the DRAM bit-line SBL/SBL# 902 and NVM bit-line nvBL/nvBL# 904 may be initialized at ground level before read. Then, the NVM cell may be turned on by nvWL and DRAM cell by SWL while turning on the device Ts. A VDD voltage level may be applied to nvSL 914, the nvBL/nvBL# may be charged up through the NVM cell. Finally, the SA power may be ramped up. Due to the Vt difference between the differential NVM cell, SBL/SBL# may have a difference and then the data may be latched a sense amplifier. At the same time, the data is written into DRAM cell.

To write data from DRAM to NVM, an erase operation may need to be executed before program, tunneling erase may be used and the nvWL may need bias to a negative voltage. A program operation may bias the nvWL and nvSL to a positive high voltage level and nvBL to a ground level, while if a level higher than 1V applied to nvBL, the program may be inhibited. For example, the DRAM cell data may be a '1' state, which Q=1 and QB=0, when the SWL and nvmEN signal are turned on, the nvBL/nvBL# may be biased to (VDD−Vt)/0, the cell on nvBL may not be programmed and the cell on nvBL# may be programmed to a HVt state. The NVM cell is not limited to a SONOS cell, but also may also be the floating gate cell, eFlash cell, pFlash cell and so on.

Figure 10:
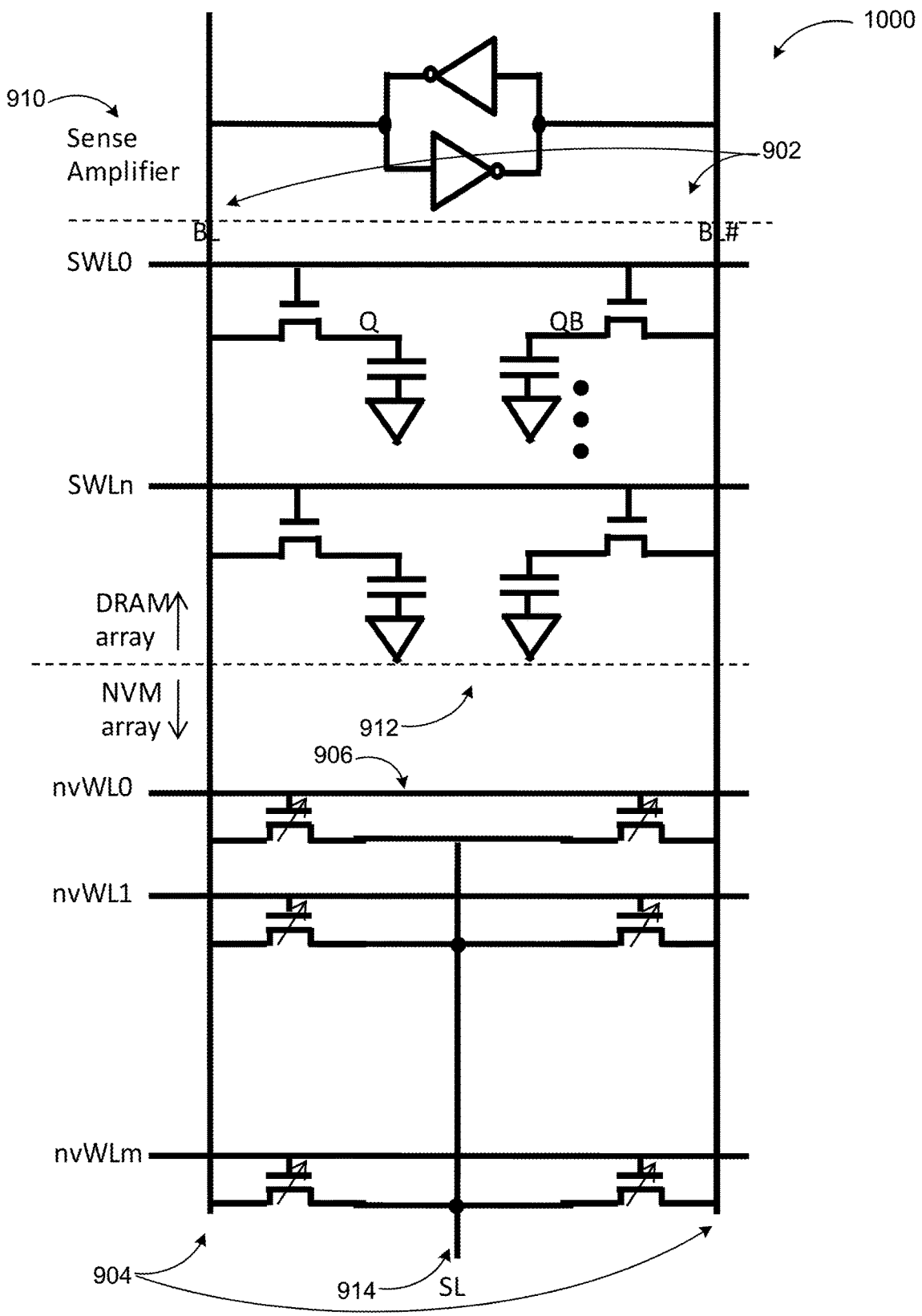
FIG. 10 is a schematic circuit diagram illustrating an example multi-bit nvDRAM device with arrayed two-transistor DRAM cells and two-transistor NVM cells, where a shared bit line is used instead of a bit line isolation device.

FIG. 10 is a schematic circuit diagram illustrating an example multi-bit nvDRAM device with arrayed two-transistor DRAM cells and two-transistor NVM cells, where a shared bit line is used instead of a bit line isolation device, arranged in accordance with at least some embodiments described herein.

As shown in diagram 1000 of FIG. 10, a small array of DRAM and NVM cells may be implemented, only a few rows for both DRAM array and NVM array. In this case, the device Ts may be removed and the structure may be simplified as a bit-line sharing structure of the DRAM array and the NVM array. Due to the small array density, the bit-line loading is still small. The DRAM read/write speed is still fast and still low power.

Figure 11:
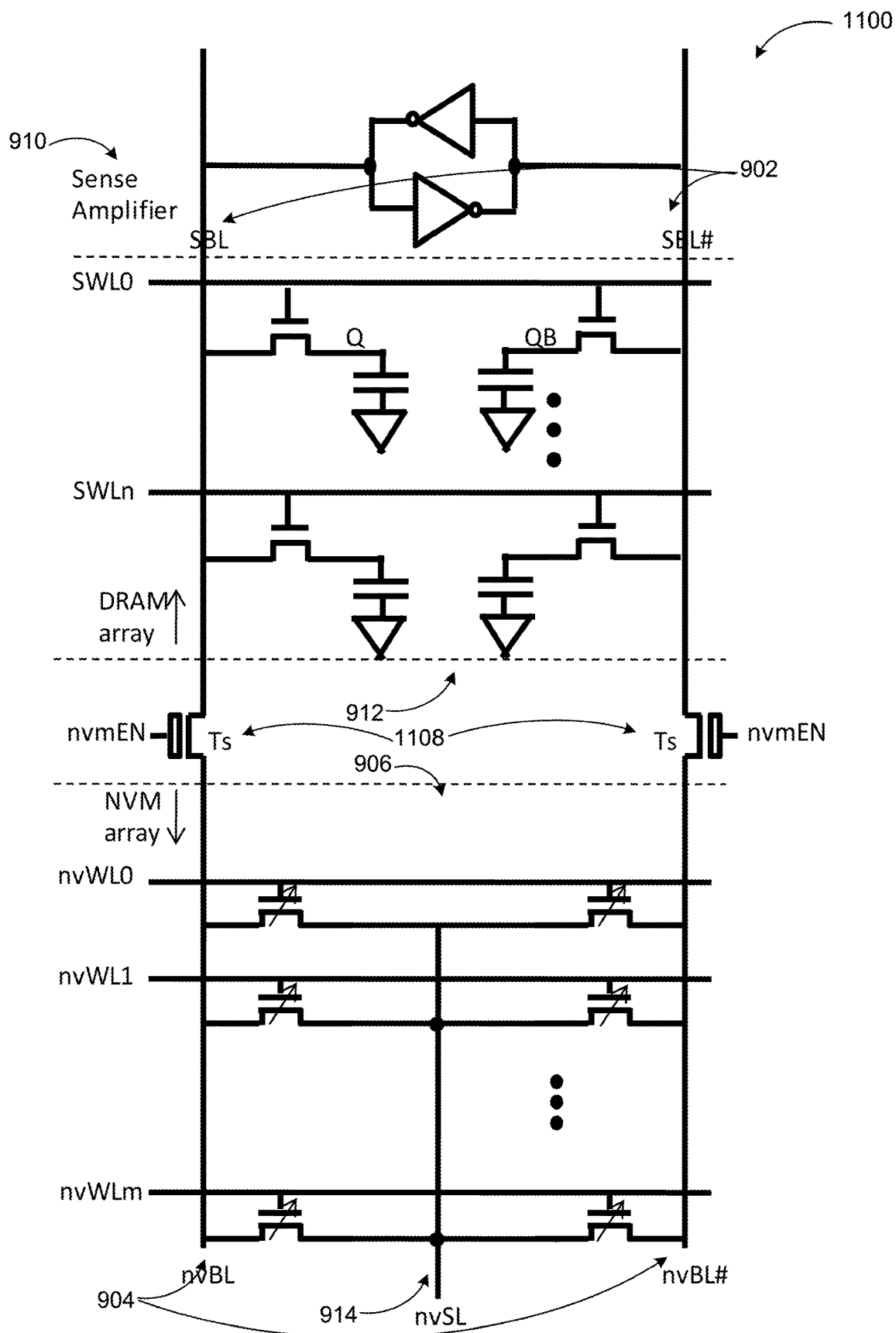
FIG. 11 is a schematic circuit diagram illustrating an example multi-bit nvDRAM device with arrayed two-transistor DRAM cells and two-transistor NVM cells including a high voltage device as the bit line isolation device.

FIG. 11 is a schematic circuit diagram illustrating an example multi-bit nvDRAM device with arrayed two-transistor DRAM cells and two-transistor NVM cells including a high voltage device as the bit line isolation device, arranged in accordance with at least some embodiments described herein.

In some embodiments, as shown in diagram 1100, the BL isolation device Ts may use a high voltage (HV) device 1108. An NVM cell that may bias a high voltage (higher than VDD) to nvBL/nvBL# for write operation. The HV device 1108 Ts may isolate the DRAM bit-line form the high voltage applied to the NVM bit-line. Extra write driver for NVM bit-line may be needed.

Figure 12:
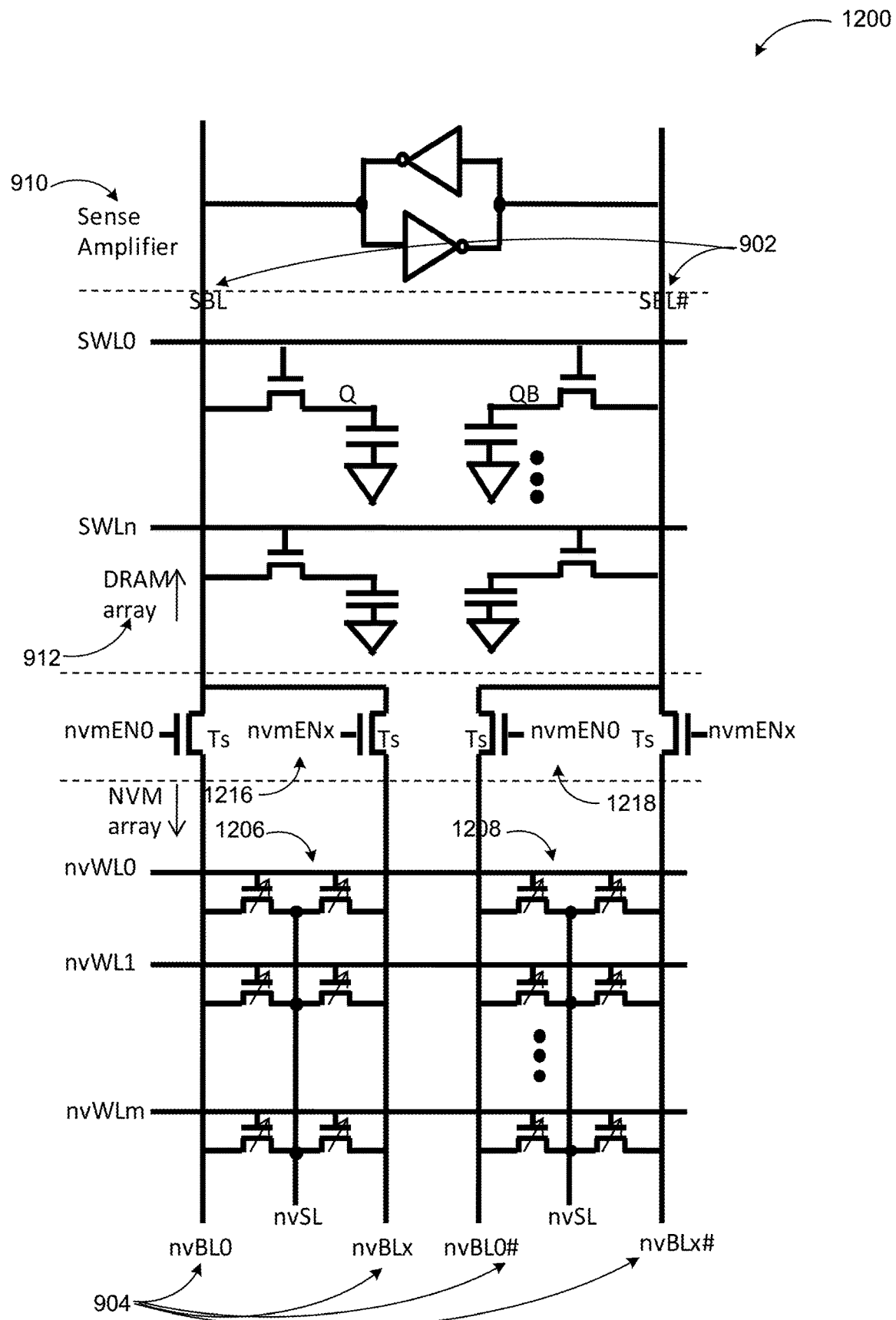
FIG. 12 is a schematic circuit diagram illustrating an example multi-bit nvDRAM device with arrayed two-transistor DRAM cells and two-transistor NVM cells, where the DRAM bit line may be coupled to multiple NVM bit lines.

FIG. 12 is a schematic circuit diagram illustrating an example multi-bit nvDRAM device with arrayed two-transistor DRAM cells and two-transistor NVM cells, where the DRAM bit line may be coupled to multiple NVM bit lines, arranged in accordance with at least some embodiments described herein.

Diagram 1200 shows an example nvDRAM device with dual NVM columns 1206, 1208. In one embodiment, the DRAM bit-line SBL can be connected to multiple NVM bit-lines nvBL[x:0], which can be decoded by the select signal nvmEN[x:0]. To read data from NVM to DRAM, nvmEN0 1218 may be enbaled, the differential pair state on nvBL0/nvBL0# may be loaded into the DRAM cell. Next, nvmENx 1216 may be enabled, the differential pair state on nvBLx/nvBLx# may be loaded into the DRAM cell.

To write data from DRAM to NVM, a program operation may be executed on nvBL0/nvBL0# by turning on nvmEN0, while other bit-line such as nvBLx/nvBLx# may be floating and the program may be inhibited.

Figure 13:
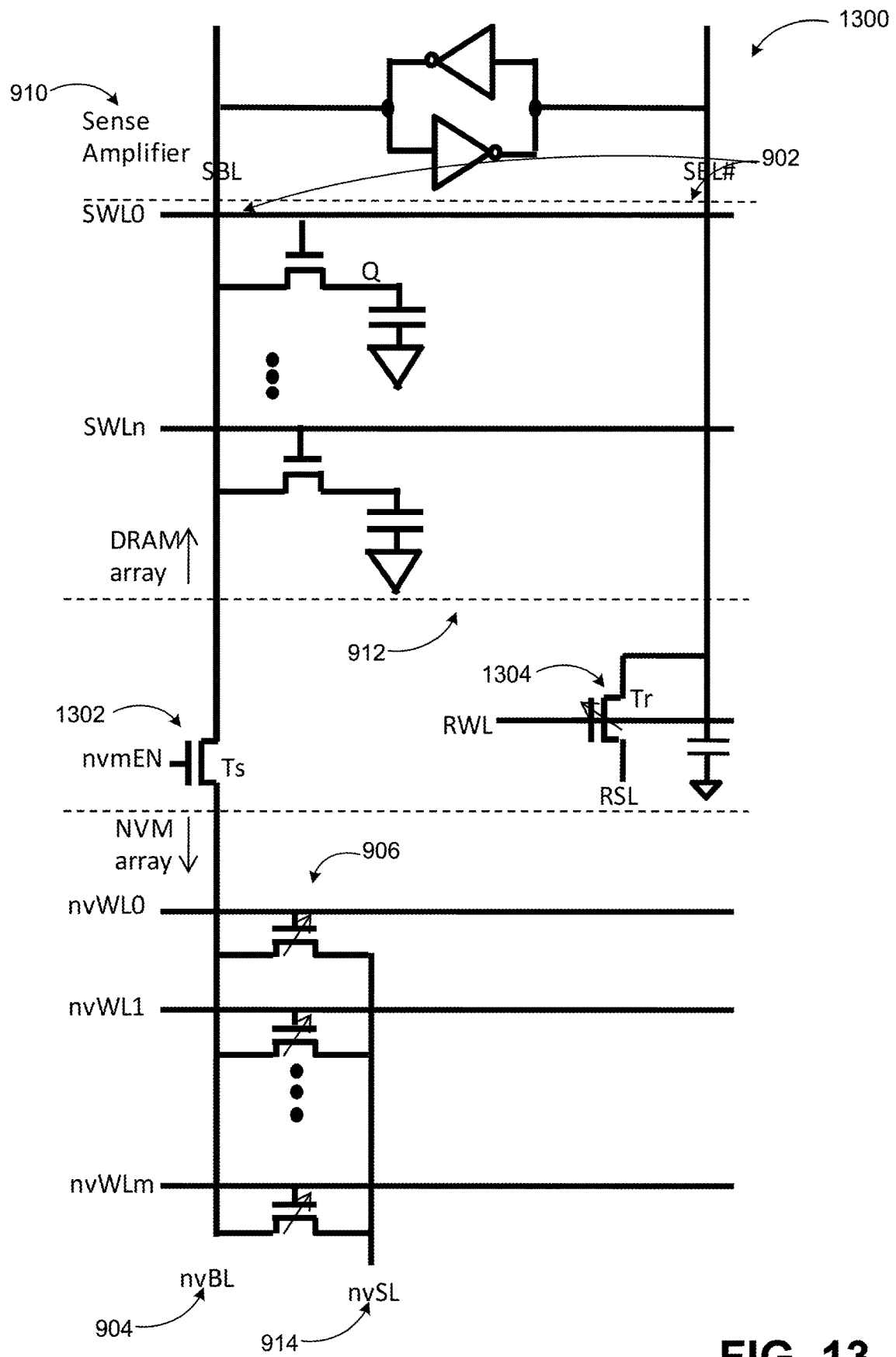
FIG. 13 is a block diagram illustrating an example multi-bit nvDRAM device with arrayed two-transistor DRAM cells and two-transistor NVM cells, where the NVM has a single cell structure as opposed to previously shown differential pair structure.

FIG. 13 is a block diagram illustrating an example multi-bit nvDRAM device with arrayed two-transistor DRAM cells and two-transistor NVM cells, where the NVM has a single cell structure as opposed to previously shown differential pair structure, arranged in accordance with at least some embodiments described herein.

Compared with the differential pair structure, the NVM cell array may be saved by using single cell structure. In the example circuit shown in diagram 1300, an NVM column 906 is connected with DRAM bit-line SBL through the device Ts 1302. The read operation may be started with a VDD level applied to nvSL/RSL and turn on the DRAM cell word-line and NVM cell/reference cell word-line. The SBL may be charged through the NVM cell while SBL# may be charged through a reference cell 1304. The different cell Vt between NVM cell and reference cell 1304 may make a voltage difference between SB1 and SBL#. Then, the DRAM power may be ramped up to latch the data with a sense amplifier. In some embodiments, a bit-line capacitance CBL may be tied to the reference side, which can compensate the NVM bit-line loading for SBL/SBL# match.

The NVM cell may also be connected with SBL#, while the reference cell is connected with SBL. In the single cell structure, the DRAM bit-line SBL may also be connected to multiple NVM bit-lines for layout pitch alignment. In the single cell structure, the NVM cell may be a SLC cell, also the NVM cell can be a MLC cell. A complex read/write flow may be needed when use the MLC cell.

Figure 14:
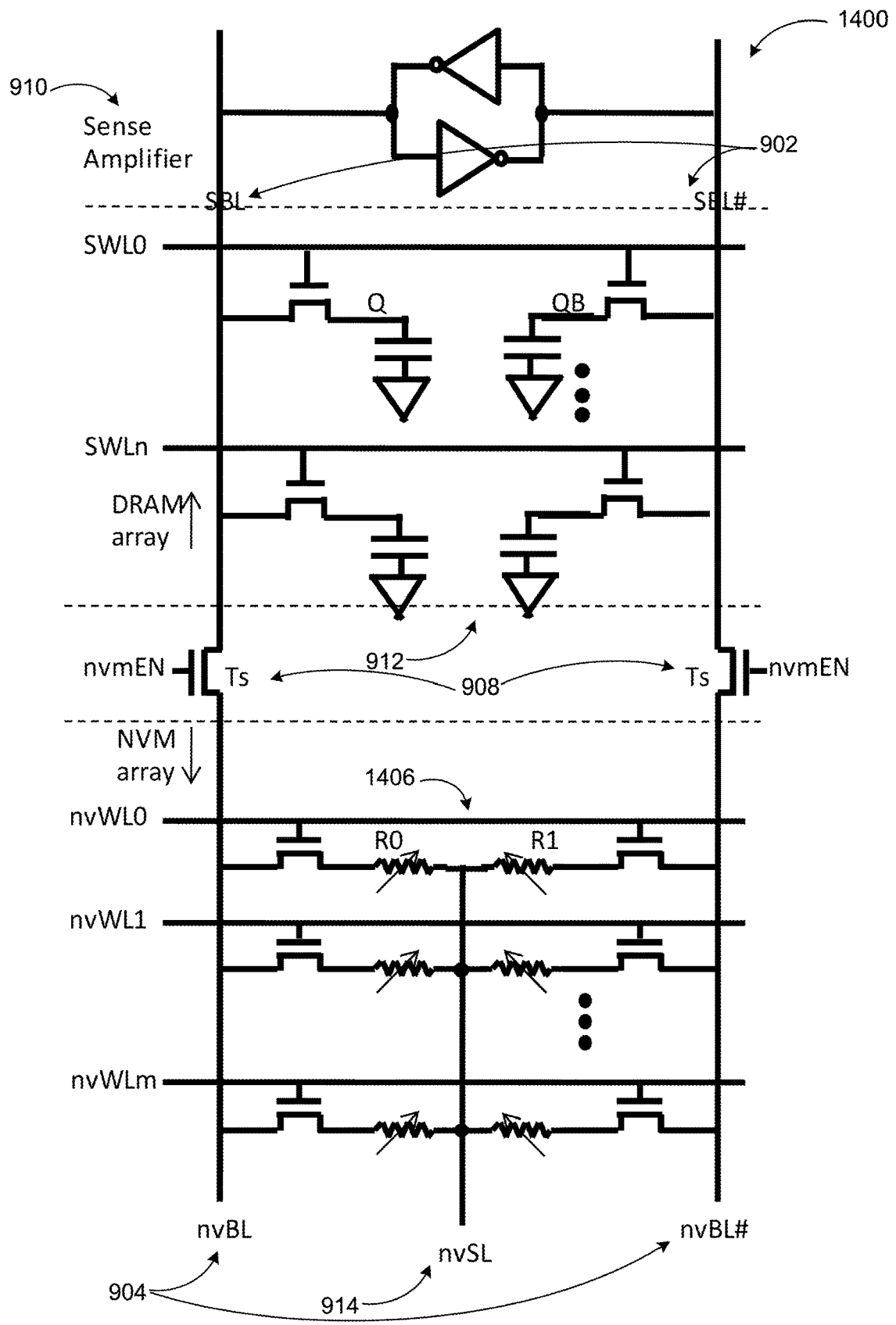
FIG. 14 is a block diagram illustrating an example multi-bit nvDRAM device with arrayed two-transistor DRAM cells and two-transistor NVM cells, where the NVM has a one-transistor-one-resistor (1T1R) cell structure.

FIG. 14 is a block diagram illustrating an example multi-bit nvDRAM device with arrayed two-transistor DRAM cells and two-transistor NVM cells, where the NVM has a one-transistor-one-resistor (1T1R) cell structure, arranged in accordance with at least some embodiments described herein.

As shown in diagram 1400, the NVM 1406 cell can be a 1T1R cell including a switch device and a programmable resistor. The source-line nvSL may be a common line for the array cell, also may be a separated signal line for each column. The programmable resistor may be programmed to at least two resistance states, a LRS (low resistance state) and a HRS (high resistance state).

In one embodiment, the programmable resistor may be a MRAM device. E.g. a STT MTJ device (a spin transfer torque magnetic tunnel junction resistor). A voltage (equal to VDD, or higher than VDD, in some examples) may be applied to nvSL, and nvBL/nvBL# pulled to ground while nvWL0 active, both R0 and R1 may be turned to a LRS state.

A voltage (VDD-Vt, for example) may be applied to nvBL, and ground level to nvSL, R0 may be turned to a HRS state by turning on nvWL0. R1 may be turned to HRS state by applying nvBL# to VDD, nvSL to ground and nvWL0 to VDD.

Before data transfer from DRAM to NVM, nvSL may be biased to a VDD level or a higher level and nvBL/nvBL# at a ground level, activating the nvWL may turn the MTJ to a LRS state. Then, nvSL may be biased to a ground level, activating DRAM word-line, Ts and NVM word-line, DRAM cell and sense amplifier may drive nvBL/nvBL# to a logic '0' or '1' level. For example, Q=1/QB=0, nvBL may be at VDD-Vt while nvBL# at ground level, R0 may be turned to a HRS state while R1 keeps at the LRS state. And vice-versa, Q=0/QB=1 may turn R1 to HRS state while R0 keeps a LRS state.

For data transfer from NVM to DRAM, the DRAM word-line may be activated, turning on Ts and NVM WL, then ramping up the sense amplifier power. A data '1' may be stored when R0/R1 at a HRS/LRS state, and a data '0' may be stored when R0/R1 at a LRS/HRS state. The NVM word-line may be biased at a level lower than VDD to get a low read level to reduce the disturb. The programmable resistor element is not limited to MRAM, but also can be a PCRAM, FeRAM, RRAM and so on.

Some embodiments are directed to example processes to operate a multi-bit non-volatile DRAM devices. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

Figure 15:
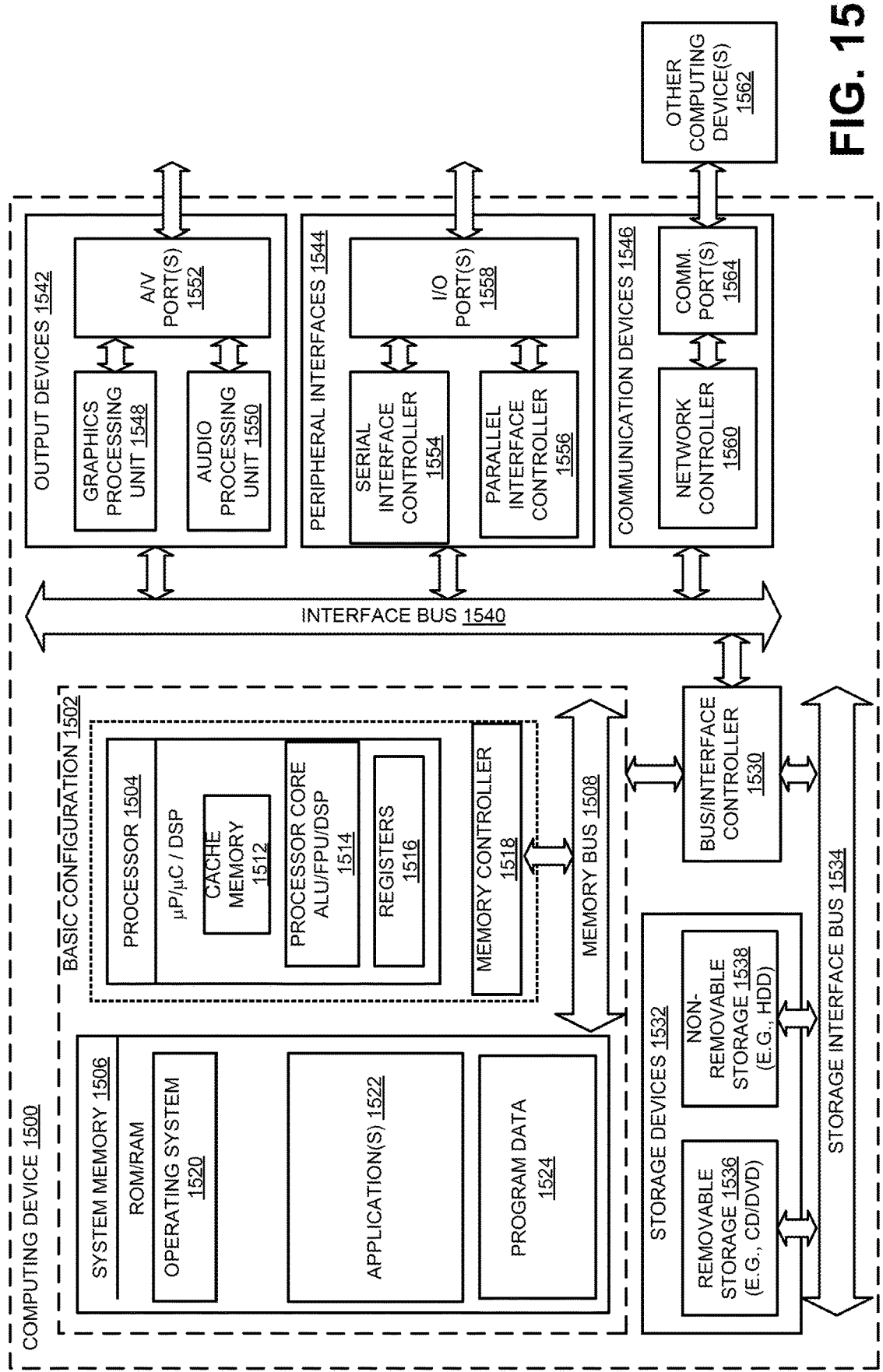
FIG. 15 is a block diagram illustrating an example computing device that is arranged for implementing NVM/DRAM based memory structures discussed herein.

FIG. 15 is a block diagram illustrating an example computing device 1500 that is arranged to incorporate or operate DRAM based memory structures, in accordance with at least some embodiments described herein. In a very basic configuration 1502, computing device 1500 typically includes one or more processors 1504 and system memory 1506. A memory bus 1508 can be used for communicating between the processor 1504 and the system memory 1506.

Depending on the desired configuration, processor 1504 can be of any type including but not limited to a microprocessor (µP), a microcontroller (µC), a digital signal processor (DSP), or any combination thereof. Processor 1504 can include one more levels of caching, such as cache memory 1512, a processor core 1514, and registers 1516. The processor core 1514 can include an arithmetic logic unit (ALU), a floating point unit (FPU), a digital signal processing core (DSP core), or any combination thereof. A memory controller 1518 can also be used with the processor 1504, or in some implementations the memory controller 1515 can be an internal part of the processor 1504.

Depending on the desired configuration, the system memory 1506 can be of any type including but not limited to volatile memory (such as RAM), non-volatile memory (such as ROM, flash memory, etc.) or any combination thereof. System memory 1506 typically includes an operating system 1520, one or more applications 1522, and program data 1524.

Computing device 1500 can have additional features or functionality, and additional interfaces to facilitate communications between the basic configuration 1502 and any required devices and interfaces. For example, a bus/interface controller 1540 can be used to facilitate communications between the basic configuration 1502 and one or more data storage devices 1532 via a storage interface bus 1534. The data storage devices 1532 can be removable storage devices 1536, non-removable storage devices 1538, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 1506, removable storage 1536 and non-removable storage 1538 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 1500. Any such computer storage media can be part of device 1500. Thus, any of the computer storage media may be implemented using the DRAM based memory structures as discussed herein.

Computing device 1500 can also include an interface bus 1540 for facilitating communication from various interface devices (e.g., output interfaces, peripheral interfaces, and communication interfaces) to the basic configuration 1502 via the bus/interface controller 1530. Example output devices 1542 include a graphics processing unit 1548 and an audio processing unit 1550, which can be configured to communicate to various external devices such as a display or speakers via one or more A/V ports 1552. Example peripheral interfaces 1544 include a serial interface controller 1554 or a parallel interface controller 1556, which can be configured to communicate with external devices such as input devices (e.g., keyboard, mouse, pen, voice input device, touch input device, etc.) or other peripheral devices (e.g., printer, scanner, etc.) via one or more I/O ports 1558. An example communication device 1546 includes a network controller 1560, which can be arranged to facilitate communications with one or more other computing devices 1562 over a network communication via one or more communication ports 1564. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 1500 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1500 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A multi-bit non-volatile dynamic random access memory (nvDRAM) device, comprising:
    a dynamic random access memory (DRAM) array having a plurality of DRAM cells arranged by rows of word lines and a column of bit lines (BLs);
    a non-volatile memory (NVM) array having a plurality of NVM cells, wherein the DRAM array and the NVM array arranged by rows of word lines and a column of the same BLs, the DRAM array and the NVM array being on the same column; and
    one or more of isolation devices coupled between the DRAM array and the NVM array and configured to control connection between DRAM bit lines BLs and NVM BLs.

2. The multi-bit nvDRAM device of claim 1, wherein at least a portion of control gates of the DRAM cells are coupled to a same DRAM word line (WL), and wherein one or more sources and one or more drains of at least some of the DRAM cells are coupled to the BLs.

3. The multi-bit nvDRAM device of claim 2, wherein data of one row of DRAM cells are transferred to or from one of N rows of NVM cells connected to the one row of DRAM cells with N greater or equal to 1.

4. The multi-bit nvDRAM device of claim 1, wherein the NVM cells are arranged in a differential transistor pair or a single cell configuration.

5. The multi-bit nvDRAM device of claim 1, wherein the one or more isolation devices include a NMOS transistor, a PMOS transistor, or a high voltage transistor.

6. The multi-bit nvDRAM device of claim 1, wherein at least a portion of control gates of the NVM cells are coupled to a same NVM word line, and wherein one or more sources and one or more drains of at least some of the NVM cells are coupled to the BLs and a source line (SL).

7. The multi-bit nvDRAM device of claim 1, wherein the DRAM cells are arranged in a differential transistor pair configuration.

8. The multi-bit nvDRAM device of claim 1, wherein the one or more isolation devices are turned on to facilitate a data transfer between the DRAM cells and the NVM cells.

9. The multi-bit nvDRAM device of claim 1, wherein data transfer between the DRAM cells and the NVM cells is based on a row-by-row transfer.

10. The multi-bit nvDRAM device of claim 1, wherein at least one of the NVM cells includes a SONOS split gate cell, a floating gate cell, an eFlash cell, a pFlash cell, a 1T1R resistive RANI, a resistive memory based cell, a phase change memory based cell, a ferroelectric RANI based cell, or a magnetic RANI based cell.

11. The multi-bit nvDRAM device of claim 1, further comprising a plurality of columns of DRAM cells and corresponding plurality of columns of NVM cells, the nvDRAM device arranged as a matrix of nvDRAM columns and wordlines.

12. A multi-bit non-volatile dynamic random access memory (nvDRAM) device, comprising:
    a dynamic random access memory (DRAM) array having a plurality of DRAM cells arranged by rows of word lines and columns of bit lines (BLs);
    a non-volatile memory (NVM) array having a plurality of NVM cells arranged by rows of word lines and a column; and one or more of isolation devices coupled between one side of the DRAM array and the NVM array and configured to control connection between DRAM bit lines (BLs) and the NVM column, wherein another side of each of the DRAM columns is coupled to a reference circuit comprising a transistor device configured as an NVM cell with a source terminal coupled to a DRAM BL and a drain terminal coupled to a reference source line, and a capacitor coupled between the DRAM BL and a ground reference.

13. The multi-bit nvDRAM device of claim 12, wherein the DRAM cells are arranged in a differential transistor pair or single transistor configuration.

14. The multi-bit nvDRAM device of claim 12, wherein data of one row of DRAM cells are transferred to or from one of N rows of NVM cells connected to the one row of DRAM cells with N greater or equal to 1.

15. The multi-bit nvDRAM device of claim 12, wherein the NVM cells are arranged in a differential transistor pair or a single cell configuration.

16. The multi-bit nvDRAM device of claim 12, wherein the one or more isolation devices include a NMOS transistor, a PMOS transistor, or a high voltage transistor.

17. The multi-bit nvDRAM device of claim 12, wherein the one side of each DRAM BL is charged through the NVM column and the other side of each DRAM BL is charged through the reference circuit.

18. A multi-bit non-volatile dynamic random access memory (nvDRAM) device, comprising:
- a dynamic random access memory (DRAM) array having a plurality of DRAM cells arranged by rows of word lines and a column of bit lines (BLs), the DRAM cells having a differential transistor pair configuration;
- a non-volatile memory (NVM) array having a plurality of NVM cells, wherein the DRAM array and the NVM array arranged by rows of word lines and a column of the same BLs, the DRAM array and the NVM array being on the same column, the NVM cells having a single transistor configuration; and
- one or more of isolation devices coupled between the DRAM array and the NVM array and configured to control connection between DRAM bit lines BLs and NVM BLs.

19. The multi-bit nvDRAM device of claim 18, further comprising a sense amplifier coupled to each column and a pre-charge circuit coupled to each column.

* * * * *